(12) United States Patent
Romesburg

(10) Patent No.: US 6,741,966 B2
(45) Date of Patent: May 25, 2004

(54) METHODS, DEVICES AND COMPUTER PROGRAM PRODUCTS FOR COMPRESSING AN AUDIO SIGNAL

(75) Inventor: Eric Douglas Romesburg, Chapel Hill, NC (US)

(73) Assignee: Telefonaktiebolaget L.M. Ericsson, Stockholm (SE)

(*) Notice: Subject to any disclaimer, the term of this patent is extended or adjusted under 35 U.S.C. 154(b) by 591 days.

(21) Appl. No.: 09/766,783

(22) Filed: Jan. 22, 2001

(65) Prior Publication Data

US 2002/0133356 A1 Sep. 19, 2002

(51) Int. Cl.⁷ .............................................. G10L 19/00
(52) U.S. Cl. ...................... 704/500; 704/501; 704/502; 704/503; 704/504
(58) Field of Search ................................. 704/500, 501, 704/502, 503, 504

(56) References Cited

U.S. PATENT DOCUMENTS

| | | | |
|---|---|---|---|
| 5,208,866 A | 5/1993 | Kato et al. ................... 381/107 |
| 5,214,708 A | * 5/1993 | McEachern .................. 381/48 |
| 5,396,562 A | 3/1995 | Ishimitsu et al. ............ 381/107 |
| 5,832,444 A | 11/1998 | Schmidt ....................... 704/500 |
| 5,923,767 A | 7/1999 | Frindle et al. ............... 381/106 |
| 6,009,390 A | * 12/1999 | Gupta et al. ................. 704/240 |

FOREIGN PATENT DOCUMENTS

EP     0 600 164 A1    6/1994   ........... H04R/3/02

OTHER PUBLICATIONS

R. Bennett; *Dynamics Processing Primer, Part 1*, Sound & Communications pp 60–68.

J. Crenshaw; *The Last of the Integers*; Embedded Systems Programming (Mar. 1998) pp 27–44.

R. Swenson et al; *Simple Addition to Logarithmic Compressor Reduces Noise*; Electronic Designs (Jun. 1998).

International Search Report for PCT/US 01/49166; Date of Mailing—Mar. 19, 2003.

* cited by examiner

*Primary Examiner*—Susan McFadden
(74) *Attorney, Agent, or Firm*—Myers Bigel Sibley & Sajovec

(57) ABSTRACT

A method of compressing an audio signal can include accepting input samples of the audio signal wherein the input samples include non-zero input samples. A logarithm of each of the non-zero input samples of the audio signal can be calculated. Compressed output samples for each non-zero input sample can then be determined based on the logarithm of each respective non-zero input sample. Preferably, a linear relationship may exist between logarithms of the non-zero input samples and logarithms of the corresponding compressed output samples. A logarithm of each compressed output sample, corresponding to a non-zero input sample, may be based on a product of a logarithm of each corresponding non-zero input sample and a compression factor. Related devices and computer program products are also discussed.

93 Claims, 10 Drawing Sheets

METHODS, DEVICES AND COMPUTER PROGRAM PRODUCTS FOR COMPRESSING AN AUDIO SIGNAL

BACKGROUND OF THE INVENTION

The present invention relates to the field of audio processing, and more particularly to audio compression.

To provide a desired loudness, it may be useful to apply gain to an audio signal if the magnitude of the audio signal falls below a threshold. On the other hand, when it appears that the magnitude may exceed a predetermined clipping level, the magnitude of the output signal may be clipped for safety reasons, such as limiting the sound pressure level. Compression of audio input signals may thus be used to reduce the dynamic range of an audio input signal, while reducing clipping.

Conventional compressors may have a gain adjusting device and a control system which controls the gain as a function of the input signal to reduce the level differences between high and low intensity portions of an audio signal. A time varying gain, that varies depending on the amplitude of the input signal, may then be used to compress the input signal. Therefore, a compressor may be used to reduce the gain in the audio path when the signal level exceeds a predetermined threshold. This can reduce the likelihood that the output signal may exceed a predetermined clipping level.

In compressing the audio signal, however, it may be desirable to avoid hard-clipping or "flat-topping" on peaks of the audio signal. Hard-clipping typically occurs when the magnitude of the output signal exceeds the clipping level. Hard-clipping can, however, undesirably decrease the intelligibility of audio signals. For example, in a noisy environment, if hard-clipping occurs in the receive path, the user may not be able to find a comfortable volume setting since a setting high enough to hear a remote voice over the noise may cause unacceptable distortion. Providing sufficient loudness, while preserving intelligibility, may make it desirable to compress rather than clip a signal to reduce and/or eliminate distortion.

According to conventional compression techniques, input and output levels can be determined based on either RMS detection, peak detection, and/or a combination of RMS and peak detection. In each case, the input and output levels can be based on past measurements of the input. These past measurements of the input can then be used to control the gain of a linear amplifier thereby providing compression. As a result, conventional compressors may base compression only on past information about the input signal. Moreover, since conventional compression techniques may utilize the RMS value of the input signal to control compression, merely adding noise to a given voice signal may cause gain to be reduced making it difficult to hear the voice signal, as may occur, for instance, in the AMPS system.

Compression for instantaneous input samples can be determined, for example, using RMS measurements based on a plurality of past input samples. In particular, a compression can be chosen so that a logarithm of an RMS measurement of expected output samples is a function of a logarithm of RMS measurements of past input samples. For example, given a compression of 0.5, there could be a one decibel change in the output for every two decibel change in the input. Because the compression is determined based on RMS measurements of past input samples, however, clipping may result if instantaneous input values exceed an expected amplitude.

Referring to FIG. 1, shown is a graph illustrating a relationship between the logarithm of an instantaneous system input and a logarithm of an instantaneous system output for a conventional compressor as discussed above. According to FIG. 1, compression can be performed in such a way that there is a linear relationship between logarithms of the input (log(abs(x))) and the output (log(abs(y))). The horizontal line (CL) represents the clipping level of the compressor. Any signal exceeding the clipping level may be clipped by the compressor.

The slope of the line ($m_1$) remains one regardless of the magnitude of the audio input signal and clipping level of the compressor. Thus, to reduce clipping of the audio input signal, a compressor operating as illustrated in FIG. 1 may shift the value of y-intercept (b) downward. The value of the y-intercept ($b_1$) is equal to the logarithm of the system gain. Thus, in these conventional compression techniques, the y-intercept (b) of the line can be adjusted to compress the input below a threshold clipping level (CL) while the slope ($m_1$) of the line remains one.

Stated differently, when it appears probable (based on measurement of past inputs) that the product of the instantaneous input and gain may exceed the clipping level (CL), the compressor may reduce the gain to translate the line A downward along the Y axis thereby mapping line A to line B. In turn, the intersection point between the line B and the line representing the clipping level (CL) changes such that the product of logarithm of the maximum input signal and the logarithm of the system gain (i.e., the logarithm of the output) may be less than or equal to the clipping level of the compressor. As a result, the input signal can be compressed such that the logarithm of the output will likely fall below the clipping level, thereby reducing the likelihood of distortion caused by clipping.

As discussed above, conventional compression techniques may determine a shift of the y-intercept (b) (e.g., gain) for the present input based on measurements of previous inputs. As a result, conventional compression techniques may cause clipping on the leading edges of the voice signal when the gain has not yet stabilized. These conventional techniques may also cause a phenomenon known as noise pumping.

According to conventional compression techniques, the uncompressed input/output function may be parallel to the compressed input/out function, and the y-intercept of the compressed input/output function may be merely translated along the y-axis to manipulate the y-intercept of the compressed input/output function to reduce the probability that the clipping limit of the compressor is exceeded by a particular output sample. However, when an input signal increases rapidly, for example, when the user speaks after a period of silence, then clipping may occur because initial compression for the speech is based on measurements of silence.

Conventional compression techniques may also provide a hold/release time after a peak where the linear gain remains low. Low-level speech that follows high-level speech may be amplified as much as the high-level speech, and as a result, the low-level speech may not be sufficiently amplified. In addition, when fluctuating noise is added to the received voice signal, conventional compression techniques may reduce the gain based on the RMS level of the signal when noise is added into the audio signal. However, higher gain may be desired to understand the speech with the added noise.

SUMMARY OF THE INVENTION

Methods of compressing an audio signal are provided. According to one of these methods, input samples of the audio signal can be accepted, and these input samples include non-zero input samples. A logarithm of each of the non-zero input samples of the audio signal can be calculated, and compressed output samples for each non-zero input sample can be determined based on the logarithm of each respective non-zero input sample. A linear relationship may exist between logarithms of the non-zero input samples and logarithms of the corresponding compressed output samples. A logarithm of each compressed output sample, corresponding to a non-zero input sample, may be based on a product of a logarithm of each corresponding non-zero input sample and a compression factor.

The logarithm of each compressed output sample corresponding to a non-zero input sample can be based on the product of the logarithm of each corresponding non-zero input sample and the compression factor plus a logarithm of a system gain. The compression factor may be based on at least one of the logarithm of a clipping level, a logarithm of a system gain, and a logarithm of an absolute value of a peak non-zero input sample. More particularly, the compression factor can be based on a difference between the logarithm of the clipping level and the logarithm of the system gain, wherein the difference is divided by the logarithm of the absolute value of the peak input sample.

The peak input sample can be either one of the plurality of input samples for which a compressed output sample is calculated, or a peak input sample prior to the input samples for which compressed output samples are determined. The system gain can also be variable for each of the non-zero input samples. A measurement for each of the non-zero samples may be provided, and the step of determining the compression for each of the non-zero input samples may then be further based on the measurement for one of the samples. Preferably, one of the non-zero input samples having a peak absolute value is determined, such that the step of determining the compression for each of the non-zero samples is further based on the peak absolute value. The non-zero samples may be included in a frame of samples.

According to yet another method of compressing an audio signal, a frame including input samples of the audio signal can be accepted wherein the frame of input samples includes non-zero input samples. A measurement of one of the non-zero input samples of the frame can be provided, and compressed output samples can be determined for each non-zero input sample of the frame based on the measurement of one of the non-zero input samples. When the measurement of one of the non-zero input samples of the frame is provided, an absolute value of a peak non-zero input sample of the frame may be determined, and compressed output samples for each non-zero input sample of the frame can then be determined based on the absolute value of the peak non-zero input sample of the frame. A logarithm of the absolute value of the peak non-zero input sample of the frame can then be calculated.

Determining compressed output samples for each non-zero input sample of the frame may comprise determining compressed output samples for each non-zero input sample of the frame based on the logarithm of the absolute value of the peak non-zero input sample of the frame. A linear relationship may exist between logarithms of the non-zero input samples and logarithms of the corresponding compressed output samples. A logarithm of each compressed output sample corresponding to a non-zero input sample may be based on a product of a logarithm of each corresponding non-zero input sample and a compression factor plus a logarithm of the system gain. The compression factor may be equal to the logarithm of the peak absolute value of the non-zero input sample of the frame. The system gain can be variable for each non-zero input sample. Providing a measurement of one of the non-zero input samples of the frame can include determining an absolute value of a peak product of each non-zero input sample of the frame and a corresponding variable system gain.

According to other methods of compressing an audio signal, input samples of the audio signal can be accepted wherein the input samples include non-zero input samples. An absolute value of a peak non-zero input sample can then be provided, and compressed output samples for at least a plurality of the non-zero input samples can be determined based on the absolute value of the peak non-zero input sample. The input samples maybe included in a frame of input samples, and the absolute value of the peak non-zero input sample of the frame of input samples may be provided. A logarithm of the absolute value of the peak non-zero input sample may be calculated. Preferably, a linear relationship may exist between logarithms of the non-zero input samples and logarithms of the corresponding compressed output samples. A logarithm of each compressed output sample can be based on a product of a logarithm of a corresponding non-zero input sample and a compression factor plus a logarithm of a system gain. Again, the system gain can be variable for each non-zero input sample. The input samples may comprise at least two frames of input samples and the peak non-zero input sample can be from a first frame, while the compressed output samples may correspond to non-zero input samples of a second frame.

As discussed above, embodiments of the invention may include a compressor that looks at a present buffer of input samples and then computes a compression factor based on a peak input sample. The compressor can then compute the log of each input sample and use the peak value to calculate corresponding output samples. Compressors according to the present invention can thus use compression operations based on a buffer of samples to look at the future. In other words, a compression may be applied to each input sample/ such that the corresponding output samples do not exceed the clipping level.

Compression methods of the present invention may also provide greater intelligibility than conventional compression techniques. One advantage of the logarithmic relationship between the compressed samples and the corresponding input samples is that low amplitude portions of the compressed audio signal may be relatively unaffected by compression, while high amplitude portions of the audio signal may be more significantly affected by compression. Stated differently, in conventional compression techniques, both soft and loud sounds may be attenuated equally regardless of magnitude. Low-level parts of speech may be more important, however, than high-level parts of speech for intelligibility purposes. According to the present invention, loud sounds (i.e., high amplitude portions of the audio signal) and soft sounds (i.e., low amplitude portions of the audio signal) may have the different gains applied thereto. As a result, the sound generated may be loud yet clear.

Compression methods according to the present invention may reduce hard-clipping of a peak input sample when a peak follows a long period of no speech or low-level speech. Moreover, pumping of background noise in the audio signal may be reduced. For example, when speech follows a long period of no speech, the noise may not quickly drop, and then slowly increase when the speech ends.

DETAILED DESCRIPTION

The present invention may now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure may be thorough and complete, and may fully convey the scope of the invention to those skilled in the art. Like numbers refer to like elements throughout.

Figure 1:
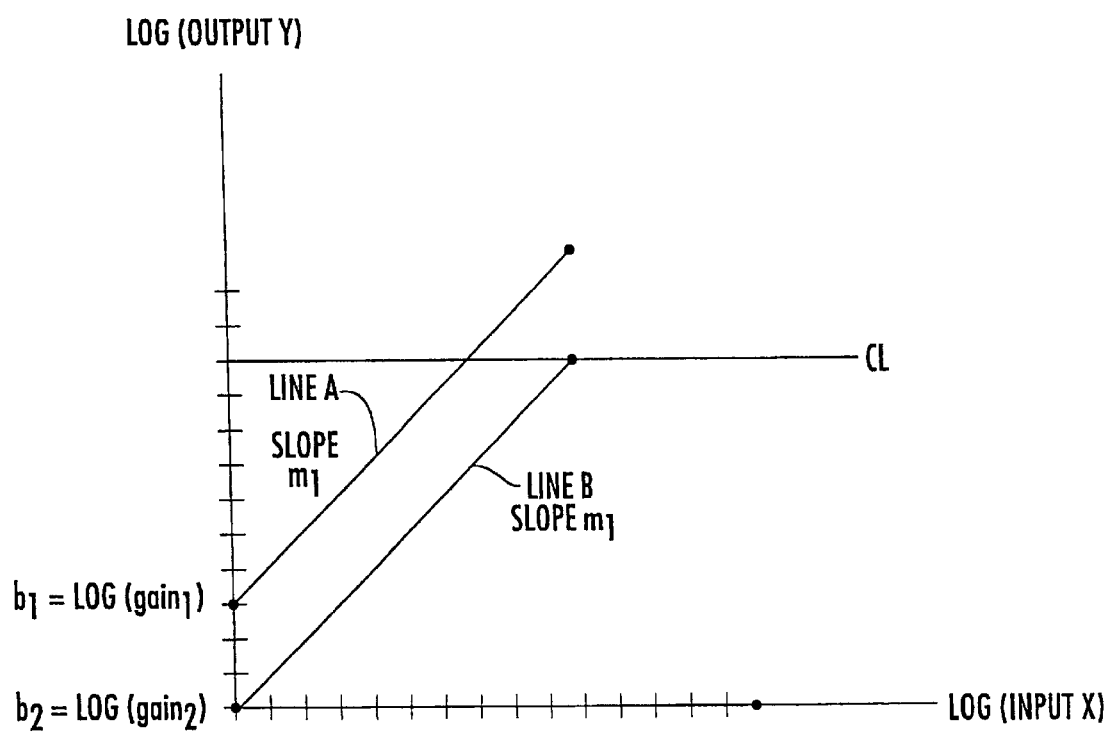
FIG. 1 is a logarithmic plot showing an instantaneous relationship (A) between a logarithm of an audio input signal and a logarithm of an uncompressed output signal prior to compression, and an instantaneous relationship (B) between the logarithm of the audio input signal and a logarithm of a compressed output signal after compression according to conventional compression techniques.
Figure 2:
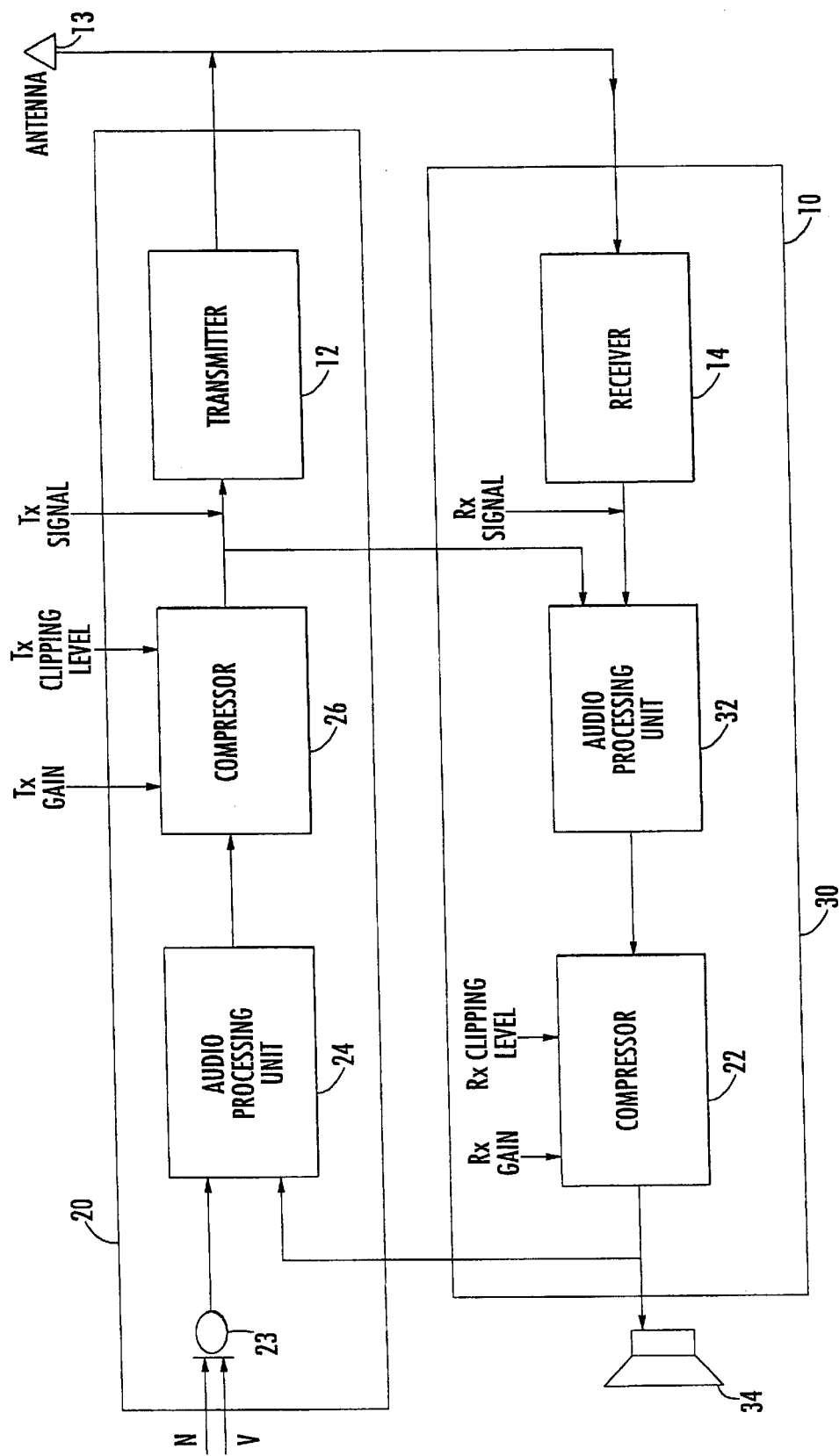
FIG. 2 is a block diagram of a communications system including a compressor.

Referring now to FIG. 2, shown is a conventional communications system 10 (e.g., a wireless communicator such as a cellular telephone), in which gain and/or clipping is used on audio signals that are transmitted from a transmitter 12 and received by receiver 14. A transmission path 20 can include a microphone 23, an audio processing unit 24, a first compressor 26, and a transmitter 12. The microphone 23 receives an audio input signal that may include, for example, noise and voice components, and provides that audio signal to the audio processing unit 24 where various audio processing functions may be performed on that audio signal. For example, the audio processing unit 24 can provide a digital representation of an analog signal generated by microphone 23 and/or provide echo reduction. Thereafter, the resulting signal can be sent along the transmission path 20 to the first compressor 26. The first compressor 26 may also receive transmitter gain and clipping level inputs. A transmission signal TX is then transmitted from the compressor 26 to the transmitter 12. From the transmitter 12, the transmission signal TX is sent to the antenna 13 where the signal is broadcast.

The receiver 14 outputs a receive signal RX to a second audio processing unit 32 that can perform various audio processing functions on the received signal RX. In addition, the transmission signal TX can also be fed forward or "cross coupled" from the compressor 26 to the second audio processing unit 32. Audio processing functions may include, for example, noise suppression, echo reduction, and/or voice recognition. The resulting signal is then output to a second compressor 22 in the receive path 30.

The second compressor 22 may also have inputs corresponding to the receiver gain and the receiver clipping level. The output of the second compressor 22 is then sent to a speaker 34 to be heard by a listener. The compressed signal output from the compressor 22 can also be fed forward or "cross coupled" to the audio processing unit 24 to facilitate echo reduction in the transmission path.

To the extent that clipping is performed on the transmit and/or receive audio signals, the clipping should be performed before the cross-coupling input to the respective audio processing unit 24, 32 (providing echo cancellation) in the opposite path to provide a linear echo path. In the transmission path 20, peak signals from the transmission signal may be unclipped prior to being input into audio processing unit 24 providing noise suppression, voice recognition, and/or echo reduction. To provide desired end-to-end loudness and output range, a higher than unity gain may be applied to the transmission signal after the transmitter audio processing functions are performed by unit 24. In the receive path 30, the gain may vary with a user-adjusted volume setting, and since this gain may be higher than unity, clipping may also be performed in the receive path 30.

Figure 3A:
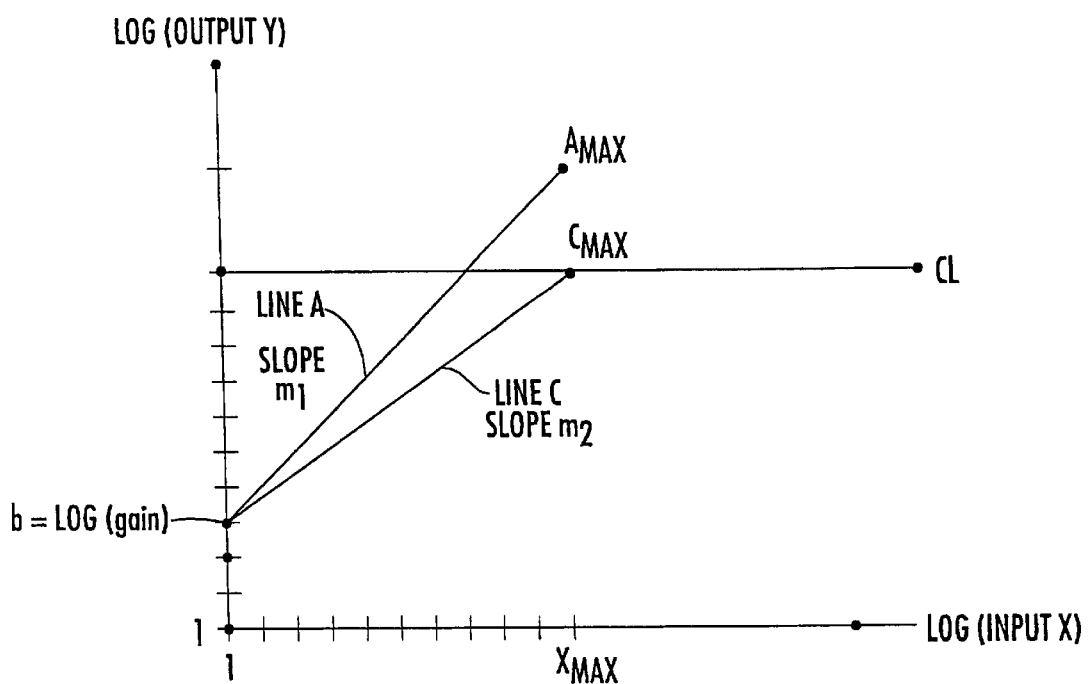
FIG. 3A is a logarithmic plot showing an instantaneous relationship (A) between a logarithm of an audio input signal and a logarithm of an uncompressed output signal prior to compression, and an instantaneous relationship (C) between a logarithm of the audio input signal and a logarithm of a compressed output signal after compression according to embodiments of the present invention.

FIG. 3A illustrates logarithmic plots of an uncompressed output function (line A) shown in FIG. 3A which exceeds the clipping level compared to a corresponding compressed output function after compression (line C) according to the present invention. FIG. 3A shows a relationship between the logarithms of uncompressed audio input/output signals (line A), and the relationship between the logarithms of compressed input/output signals (line C). Line A of FIG. 3A illustrates that when the logarithm of a maximum output value $A_{max}$ (corresponding to a maximum input sample $X_{max}$) exceeds the logarithm of the clipping level threshold (CL), compression may be used to avoid clipping.

Compression methods according to the present invention can measure the peak amplitude ($X_{max}$) of a buffer (or frame) of input samples, and then use the logarithm of each input sample to determine corresponding output samples. Consequently, when the logarithm of the peak value $A_{max}$ of the uncompressed output signal is less than the logarithm of the clipping level (CL), compression can be suspended.

Otherwise, as shown in FIG. 3A, the slope ($m_1$) of the uncompressed input/output function can be reduced to slope ($m_2$) such that a compressed input/output function, represented by line C results which may not exceed the clipping level at the peak compressed output value $C_{max}$ (corresponding to the maximum input sample $X_{max}$) Significantly, as shown in FIG. 3A, the y-intercept (b) of the system gain remains the same both before and after compression, while the slope of the output function changes to reduce the likelihood of clipping. The y-intercept value (b) is equal to the logarithm of the gain such that $y_i$=gain when $x_i$=1.

Figure 3B:
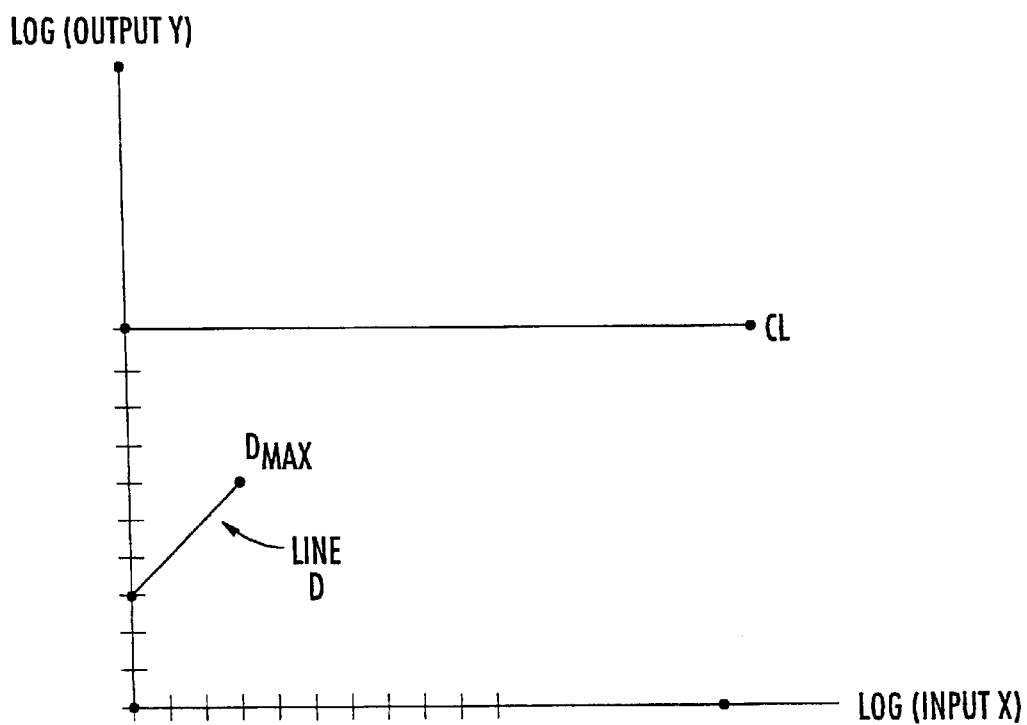
FIG. 3B is a logarithmic plot showing an instantaneous relationship (D) between a logarithm of an audio input signal and a logarithm of an uncompressed output signal when compression is not used according to embodiments of the present invention.

As shown by line D of FIG. 3B, if the product $D_{max}$ of the logarithm of the peak amplitude and the logarithm of the gain is less than or equal to the clipping level (CL), then compression can be bypassed and each output sample can be equal to the product of the input sample and the gain. That is, the remaining samples in the buffer have the same compression factor as the peak relating the logarithms of the input and output values. In other words, line D illustrates that when each of the values of the input signal times the gain falls below the clipping level threshold (CL), then clipping or compression can be suspended.

Specific embodiments of compressing an audio signal may now be discussed with reference to mathematical formulas shown below as equations (1)–(13). From the equations below, it may be seen that compression according to the present invention results in a linear relationship between the logarithms of the input and the compressed output even for instantaneous values.

$$\text{Gain} \geq 0 \quad\quad \text{equation (1)}$$

$$\text{clippingLevel} \geq 0 \quad\quad \text{equation (2)}$$

$$\text{input samples: } x_i, i=1 \text{ to buffer length} \quad\quad \text{equation (3)}$$

$$\text{output samples: } y_i, i=1 \text{ to buffer length} \quad\quad \text{equation (4)}$$

$$\text{peak}=\max(|x_i|), i=1 \text{ to buffer length} \quad\quad \text{equation (5)}$$

$$\text{if peak}=0) \text{ or (clippingLevel}=0), \quad\quad \text{equation (6)}$$

$$y_i=0, i=1 \text{ to buffer length} \quad\quad \text{equation (7)}$$

$$\text{else if (peak*gain)} \leq \text{clippingLevel} \quad\quad \text{equation (8)}$$

$$y_i=\text{gain}*x_i, i=1 \text{ to buffer length} \quad\quad \text{equation (9)}$$

To explain further, as shown in equations (1) and (2), compression according to the present invention can be used when the gain of the system is greater than or equal to zero, and when the clipping level is greater than or equal to zero. A given number i of input samples $x_i$ of the audio signal are provided at equation (3). The number of samples i can be equal to a buffer length that may correspond to the number of samples received in a radiotelephone communications frame such as a CDMA frame or a TDMA frame. For example, the length of a TDMA time slot can be 160 samples. As shown at equation (4), the resulting output samples $y_i$ correspond to respective input samples $x_i$ and therefore also may include a number of samples i equal to the buffer length. At equation (5), the peak input sample $\max(|x_i|)$ is defined as the input sample having the maximum absolute value for i=1 to buffer length.

By applying compression on a frame by frame basis with a relatively low number of samples per frame (as in a TDMA or CDMA frame), perception of changes in compression can be reduced. In other words, because each frame represents only a relatively short segment of the audio signal being processed, changes in compression from frame to frame may be relatively small and changes in compression may thus be less perceptible. As will be understood by those having skill in the art, a frame of audio samples may represent a burst of audio signals communicated, for example, according to TDMA and/or CDMA standards. Moreover, frames of audio samples may be interleaved over two or more bursts of audio signals.

Compression according to embodiments of the present invention may have three modes of operation. The first mode of operation may control when the absolute value of the peak input sample is zero or when the clipping level is zero. When the absolute value of the peak input sample is equal to zero (equation (6)), or alternatively, when the clipping level is equal to zero, each output sample $y_i$ for i=1 to buffer length will be zero (equation (7)). As shown in equations (6) and (7), in the event the peak input sample, $\max(|x_i|)$, or the clipping level (CL) is equal to zero, then the output samples $y_i$ will be zero.

The second mode of operation occurs when the magnitude of the absolute value of the peak input sample multiplied by the system gain is less than or equal to the clipping level. In this mode, the compressor may be turned off for that particular frame. This is known as the non-compression mode. In this mode each output sample can be equal to the product of the gain and the corresponding input sample for each sample within that frame as shown in equations (8) and (9). If the product of the peak input sample, $\max(|x_i|)$, and the gain is less than or equal to the clipping level (CL), then the system may be in a non-compression mode as illustrated, for example, in FIG. 3B where $D_{max}$, for the frame is less than the clipping level. In this non-compression mode the compressor is deactivated for that particular group of input samples $x_i$, and the output samples $y_i$ are equal to the product of input samples $x_i$ and gain for each sample in the buffer. In other words, if there is no memory for the peak from one frame to the next, the compression may be turned off completely for frames having no peak above the clipping level. On the other hand, when the product of the peak input sample, $\max(|x_i|)$, and the gain exceeds the clipping level (CL), compression according to the present invention can provide a compression mode shown in equations (10)–(13) below. In this compression mode, as shown in FIG. 3A, the y-intercept of the compressed output function represented by line C is the same as that of the non-compressed output function A, however, the slope $m_2$ is reduced so that the maximum compressed output $C_{max}$ (corresponding to the peak input sample $X_{max}$) or $\max(|x_i|)$ does not exceed the clipping level CL.

$$b=\log(\text{gain}) \quad\quad \text{equation (10)}$$

$$m_2 = \frac{\log(clippingLevel) - \log(gain)}{\log(peak)} \quad\quad \text{equation (11A)}$$

$$\text{sign}(x_i)=0 \text{ for } x_i=0 \quad\quad \text{equation (11B)}$$

$$\text{sign}(x_i)=1 \text{ for } x_i>0 \quad\quad \text{equation (11C)}$$

$$\text{sign}(x_i)=-1 \text{ for } x_i<0 \quad\quad \text{equation (11D)}$$

$$y_i=\log^{-1}[m_2*\log|x_i|+b]*\text{sign}(x_i), i=1 \text{ to buffer length} \quad\quad \text{equation (12)}$$

Multiplying the equation (12) on both sides by $\text{sign}(y_i)$ and then taking the log of each side produces the following relationship between the logarithms of each output sample and input sample:

$$\log(|y_i|)=m_2*\log(|x_i|)+b \quad\quad \text{equation (13A),}$$

where $$\text{sign}(y_i)=\text{sign}(x_i), \text{ and sign}^2(y_i)=1 \text{ for } y_i \neq 0 \quad\quad \text{equation (13B),}$$

and $$|y_i|=y_i*\text{sign}(y_i)) \quad\quad \text{equation (13C)}$$

In this third mode of operation, as shown in equations (13A–13C), the logarithm of the absolute value of each output sample may be linearly related to the logarithm of the absolute value of each input sample. This linear relationship may be a constant for each particular frame. This constant is symbolized as $m_2$, which is the slope of the line C shown in FIG. 3A. As shown in equation (11A), the slope $m_2$ of the line is shown as equal to the difference between the logarithm of the clipping level minus the logarithm of the system gain divided by the logarithm of the maximum or peak absolute value of the input samples in the buffer or frame. Significantly, the slope of this line is dependent upon the particular clipping level for a particular frame, and is also dependent upon the peak absolute value of an input sample for a given frame. Thus, between consecutive TDMA frames, the value of $m_2$ may change such that the compressed output does not exceed a given clipping level. As shown in equation (10), the value of the y-intercept, b, is equal to the log of the system gain. Thus, when the value of the input sample is one, the output sample may be equal to the system gain. Accordingly, relatively low amplitude portions of the audio signal may not be significantly affected by compression according to the present invention, while relatively high amplitude portions of the audio signal may be affected more significantly.

As shown in FIG. 3A and equation (12), the logarithm of the absolute value of every output sample log ($|y_i|$) may have a linear relationship with respect to the logarithms of the absolute value of each input sample log ($|x_i|$). In one embodiment of the present invention, the slope, m, of the line C is equal to the difference between the logarithm of the clipping level and the logarithm of the system gain divided by the logarithm of the peak input sample. As shown in FIG. 3A, the y-intercept (b) of both the compressed output function C and uncompressed output function A is identical.

Accordingly, there can be a linear relationship between the logarithms of the input and output signals for instantaneous values. Alternately, compression according to the present invention can also depend on a peak from a preceding frame. Compression of the present invention may look ahead in time at a buffer of input samples to find the peak. Consequently, these compression techniques may react immediately to a new peak and without clipping that new peak as may occur in conventional compression techniques. As noted above, conventional compressors may not anticipate future input values.

It should be noted that in the relationship expressed in equation (12), the logarithm operation can be in any base. For example, base 10, base e, and base 2 logarithms would all work for the present invention. A publication describing an efficient implementation of a base 2 logarithm suitable for microprocessors is entitled, "The Last of the Integers" by Jack W. Crenshaw on pages 27–44 of the March 1998 edition of Embedded Systems Programming, the entirety of which is incorporated herein by reference.

As shown in equations (14)–(16) below, the mathematical operations shown above may be rearranged to provide more tolerant approximation errors in the logarithm function by using only the ratio of the logarithm of each sample to the logarithm of the peak.

$$ratio_i = \frac{\log(|x_i|)}{\log(peak)}, i = 1 \text{ to buffer length} \quad \text{equation (14)}$$

$$y_i = \log^{-1}[\log(clippingLevel)*ratio_i + \log(gain)*(1-ratio_i)]*sign(x_i),$$
$$\text{for } i=1 \text{ to buffer length} \quad \text{equation (15)}$$

A further mathematical simplification of the equation (15) is:

$$y_i = clippingLevel^{ratio_i} * gain^{(1-ratio_i)} * sign(x_i),$$
$$\text{for } i=1 \text{ to buffer length} \quad \text{equation (16)}$$

As shown above in equation (14), the value of $ratio_i$ is defined as being equal to the log of the absolute value of an input sample divided by the log of the peak input sample for each sample within the buffer length.

Equation (16) illustrates that the anti-logarithm function is not necessary to perform compression according to the present invention. The value of each output sample $y_i$ can thus be equal to the clipping level to the $ratio_i$ power, multiplied by the gain to the ($1-ratio_i$) power, multiplied by the sign ($x_i$) of that particular sample $x_i$. Thus, in the above embodiments of the present invention discussed above, the logarithm of each input sample $x_i$ is used to calculate the corresponding output sample $y_i$.

For low magnitude signals, the value $ratio_i$ approaches zero, so that compression methods according to the present invention tend to amplify low-level portions of audio signals by approximately the system gain regardless of the peak in compression factor. For instance, an input sample having a magnitude of 1 may produce an output equal to the system gain regardless of the value of the peak input sample. Thus, the larger the input sample amplitude, the more it is affected by the compression. As a consequence, pumping of background noise in the signal with the voice can be reduced. Moreover, low-level parts of speech that are important to intelligibility can be amplified more than the peaks that are less important to intelligibility.

Applying compression as discussed above may result in the same output code for several input codes if there is insufficient precision in the log and $\log^{-1}$ or exponential functions. Compression can be made more tolerant of quantization by computing a multiplier for each input sample. Since the input sample itself is not quantized, the only quantization is in the compression factor (which is not as perceptible to the user). Other embodiments of compression according to the present invention may now be discussed below in conjunction with equations (17) through (20).

According to an alternate embodiment of compression according to the present invention, a multiplier may be used on the input signal that satisfies the relationship set forth in equations (17)–(18) below.

According to equation (17), the multiplier preferably satisfies the following constraints:

$$multiplier = \frac{clippingLevel}{peak}, \text{ for } max(|x_i|), \quad \text{equation (17)}$$

where $peak = max(|x_i|)$ and $$multiplier = gain \text{ for } |x_i| \leq 1 \text{ or } \log(|x_i|) \leq 0 \quad \text{equation (18)}$$

The following equation provides such a relationship:

$$multiplier = gain + (clippingLevel/peak - gain) * \log(|x_i|)/\log(peak),$$
$$\text{for } 1 < abs(input) < peak \quad \text{equation (19)}$$

However, for better numerical precision, equation (19) can be implemented below in equation (22) in which:

$$temp = \log(|x_i|)/\log(peak), \quad \text{equation (20)}$$

$$multiplier = temp * clippingLevel/peak + gain * (1-temp),$$
$$\text{for } 0 \leq temp \leq 1 \quad \text{equation (21)}$$

According to equation (21), the approximation for log( ) may be sufficient for the computation of the multiplier. Using the multiplier, the output samples can be calculated as:

$$y_i = multiplier * x_i \quad \text{equation (22)}$$

The equations described above may be implemented, as shown in equations (23) through (30) below.

peak=max (|$x_i$|), for $i$=1 to buffer length     equation (23)

logPeak=log(peak)     equation (24)

if peak*systemGain<=clippingLevel, then output= input*systemGain (no compression for input samples in buffer);     equation (25)

else, for each sample:

if $x_i$=0, $y_i$=0; (to avoid log of 0)     equation (26)

else if $x_i$=1, $y_i$=gain (so that 1−temp<1)     equation (27)

else if $x_i$=peak, $y_i$=clippingLevel (so that temp<1)     equation (28)

else $y_i$=multiplier*$x_i$,     equation (29)

where temp=log($x_i$)/logPeak, and multiplier=temp*(clippingLevel/peak)+gain*(1−temp)     equation (30)

Figure 4:
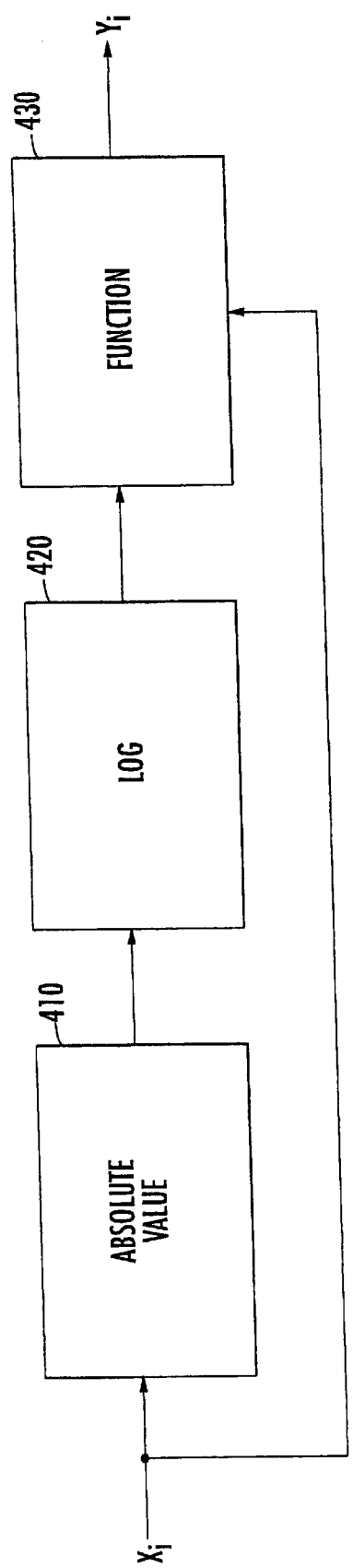
FIG. 4 is a block diagram illustrating compression according to embodiments of the present invention.

Referring now to FIG. 4, shown is a block diagram of a system for implementing compression according to the present invention. As shown in FIG. 4, an audio input signal x is sampled to provide input samples $x_i$ of the audio signal. These input samples include non-zero input samples. Thereafter, at block 410, the absolute value |$x_i$| of each input sample $x_i$ is determined. At block 420, a logarithm log |$x_i$| of the absolute value of each input sample $x_i$ is determined. At block 430, a compression function as discussed above, for example, in equations (1) through (13), may be applied to each input sample $x_i$ using the logarithm of the absolute value of the input sample to produce a corresponding output sample $y_i$. The input samples $x_i$ are also input into block 430 directly. Thus, compression according to the present invention may be performed in part by taking a logarithm of each input sample $x_i$.

Figure 5:
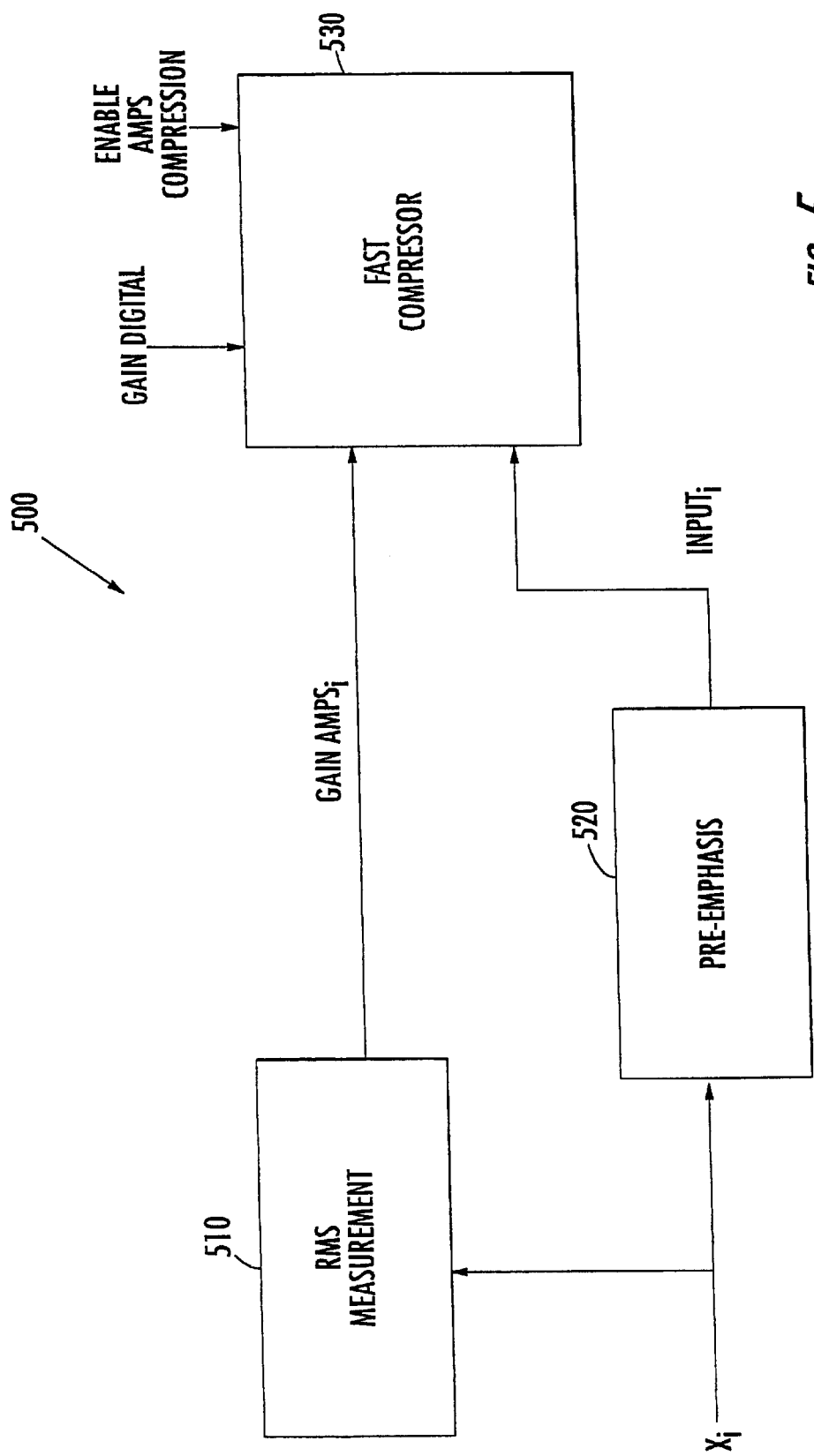
FIG. 5 is a block diagram illustrating compression according to additional embodiments of the present invention.

As shown in FIG. 5, compression according to the present invention can be implemented in an analog cellular system 500 such as an AMPS system. Since additional frequency manipulation may be required, one difference is that the AMPS system may also use pre-emphasis of the input samples at block 520 prior to compression at block 530. This compression will now be described with reference to equations (31)–(35) below.

max (input($i$)·gainAMPS($i$))=gainAmpsAtPeak     equation (31)

gain($i$)=gainAMPS($i$)·gainDIGITAL     equation (32)

$b$=log(gain($i$))     equation (33)

$$m = \frac{\log(clippingLevel) - \log(gainAmpsAtPeak \cdot gainDIGITAL)}{\log(peak)}$$     equation (34)

$y(i)$=log$^{-1}$[$m$·log(|input($i$)|)+$b$]·sign(input($i$))     equation (35)

In this embodiment, an RMS measurement circuit at block 510 provides a variable gain, gainAMPS($i$), for each input sample $x_i$. At block 520, frequency manipulation is also performed on each input sample $x_i$ during pre-emphasis to produce an input($i$) for fast compressor 530. In this embodiment, the logarithm of an absolute value of a peak product of each non-zero input sample $x_i$ of the frame and a variable system gain is linearly related to the logarithm of a corresponding output sample $y_i$. However, the peak is not necessarily greater than or equal to input($i$) for every i. Since the gain ($i$) may vary for each particular input sample, a vector of gain inputs, that has the same length as the number i of input samples $x_i$ is created. Thus, a peak is determined for each frame that is used to determine a gain($i$) for each sample $x_i$. The product of the gain($i$) for each sample $x_i$ and the magnitude of each input sample $x_i$ is equal to the corresponding output sample $y_i$ for that particular frame.

In other words, the gain for each input sample $x_i$ depends on the product of gainAMPS($i$) and gainDIGITAL, and the gainDIGITAL can be constant for each particular frame. In this embodiment, the y intercept may change for each particular gain($i$), since the y intercept is the logarithm of that particular gain($i$). Moreover, the linear relationship between the logarithm of a particular input $x_i$ and the logarithm of a corresponding output $y_i$ may change instead based on a slope m that is determined based on the difference between the log of the clipping level and the logarithm of a product of gainAmpsAtPeak and gainDIGITAL divided by the log of the peak input sample for that frame, log (peak).

As discussed above, the peak can be calculated for every frame. Since the compression for each frame may depend on the peak of that frame, discontinuities may occur at frame boundaries. These discontinuities may cause audible clicks or distortion. Therefore, it may be desirable to gradually change the compression factor between frames.

Gradual changes in the compression factor may, thus, be made to avoid compression factor discontinuities at buffer and/or frame boundaries. This may be particularly beneficial if there is a relatively large difference in the peak input sample from one frame to the next. In particular, the peak may be exponentially decayed from the last frame as a starting point in comparisons for the peak in the present frame to provide a softer decay during compression. While the noise pumping avoidance and low-level speech boosting features may be reduced, gradually changing compression between frames may be advantageous to reduce the effects of discontinuities.

To illustrate this point as shown in FIG. 3A, the slope $m_1$ of the line A may change between frames to $m_2$ (line C) in order to reduce the likelihood of clipping in a given input signal. However, as the slope of this line changes between frames, abrupt changes may cause a clicking sound to occur as the compressor switches between frames. To avoid this phenomenon, it may be desirable to exponentially change the compression factor (i.e., slope m) between frames. That is, line A is preferably not instantaneously mapped to the line C, but instead it can be mapped back in an exponential fashion.

If harmonic artifacts result from turning off the compression abruptly, the peak level can be saved from the last frame with an attenuation or "leak" factor k, if it is lower than a peak level of the new frame. The leak factor k, can be a predetermined number that is basically a time constant of exponential decay between frames. Accordingly, the peak may be equal to the maximum of either the input peak for a particular frame or the product of the attenuation factor k and the old peak. Stated differently, the peak absolute value for a given frame may be either the maximum absolute value of an input sample for that frame or the peak of a previous frame multiplied by this leak factor k. This may cause an exponential decay to reduce harmonic artifacts, but noise pumping may be somewhat more noticeable.

Figure 6A:
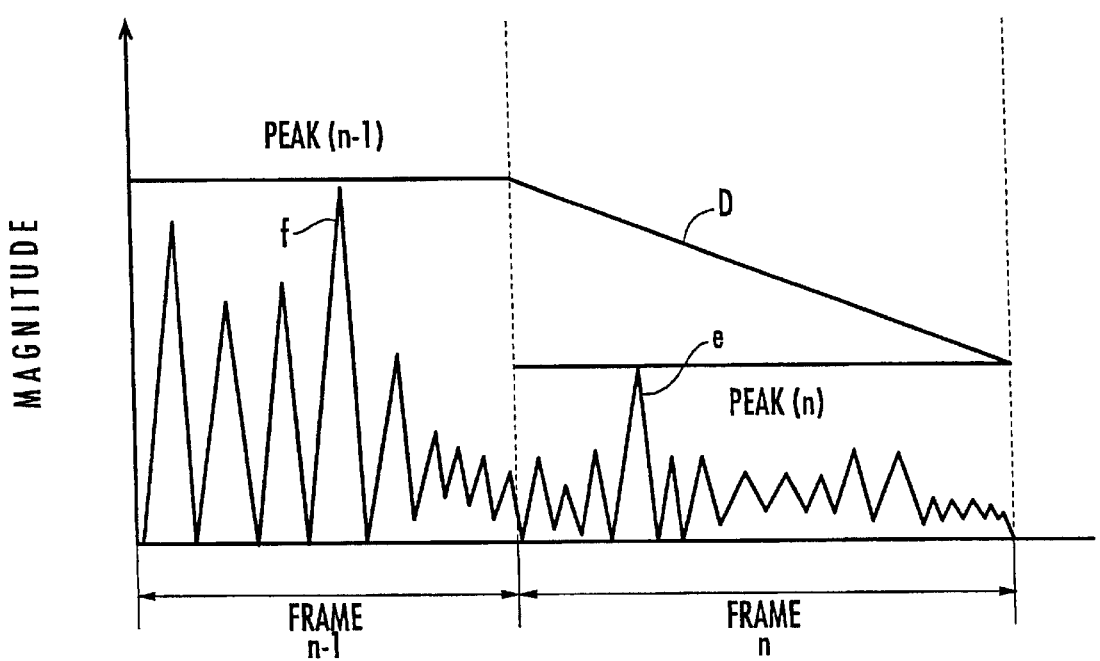
FIG. 6A is a graph illustrating magnitudes of an input signal when the peak for a frame n is less than that of a frame n−1.

As shown in FIG. 6A, when the peak e for a frame n is substantially less than the peak f of the previous frame (n−1), the compression factor can change gradually over the frame n. As shown in FIG. 6A, the sloped line D could be used instead of the peak in the compression calculations for each sample so that the peak is reduced in the calculation of each subsequent output sample for the frame n. If the peak is less than the clipping level, then the clipping level could be used as the line end point to make the change more gradual.

Figure 6B:
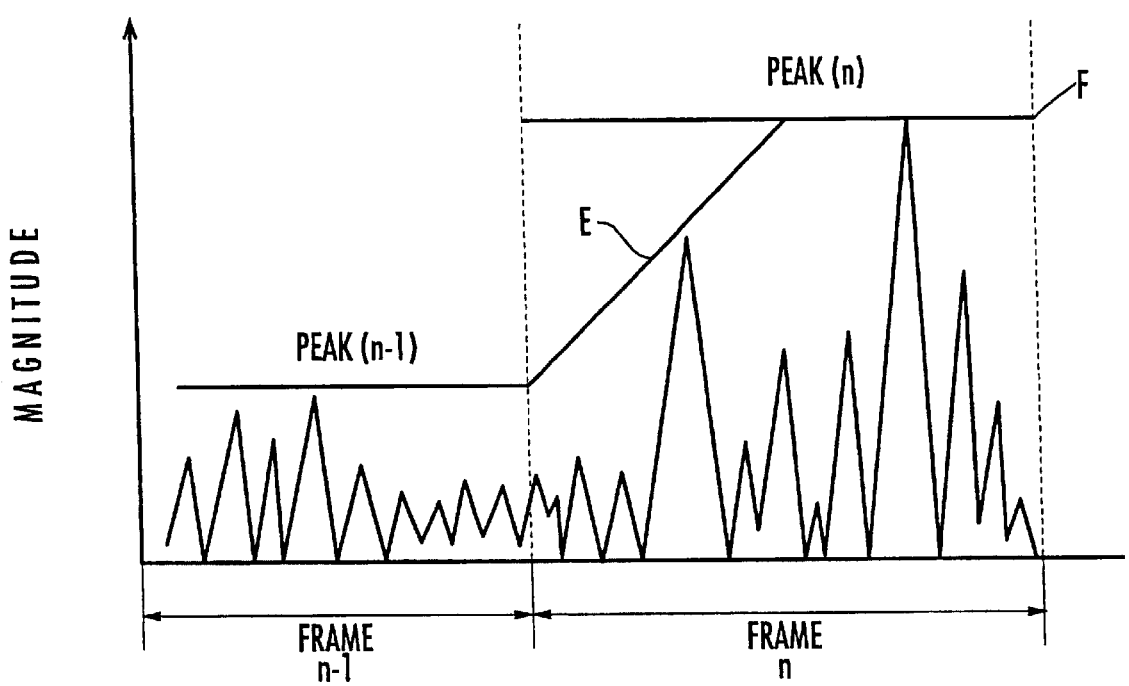
FIG. 6B is a graph illustrating magnitudes of an input signal when the peak for the frame n is greater than that of frame n−1.

Conversely, as shown in FIG. 6B, when the peak for frame n is greater than that of the previous frame (n−1), then the compression can change gradually over a portion of the frame n. In this situation, it may be more appropriate to find the maximum slope between the peak (n−1) at the start of frame n and every magnitude. By using the sloped line instead of the peak in the compression calculations for each input sample of frame n until the sloped line E intersects the horizontal line F at the peak for frame n, compression can change gradually over a segment of the frame n. If the peak for frame (n−1) and the peak for frame n are below the clipping level, then compression can be suspended, and the sloped lines need not be calculated.

Figure 7:
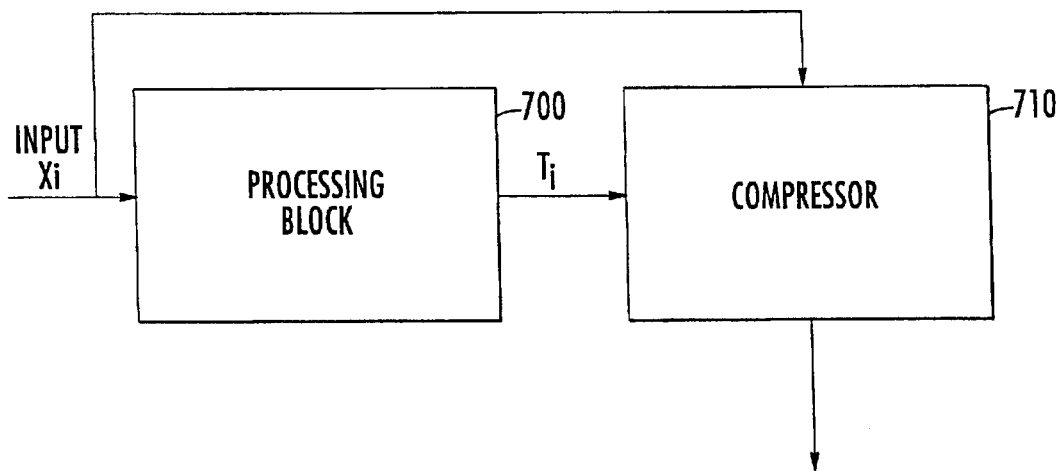
FIG. 7 is a block diagram illustrating compression according to additional embodiments of the present invention.

Referring now to FIG. 7, shown is a block diagram illustrating additional compressors according to the present invention. Input samples, $x_i$, are input into the processing block 700 and the compressor 710. The compressor 710 can determine compression based on the input samples $x_i$. After the input $x_i$ is processed at block 700 the processed samples $t_i$ are input into a compressor 710 where the input samples $x_i$ may be compressed according to the present invention, if necessary, based on the output $t_i$ of processing block 700.

Figure 8:
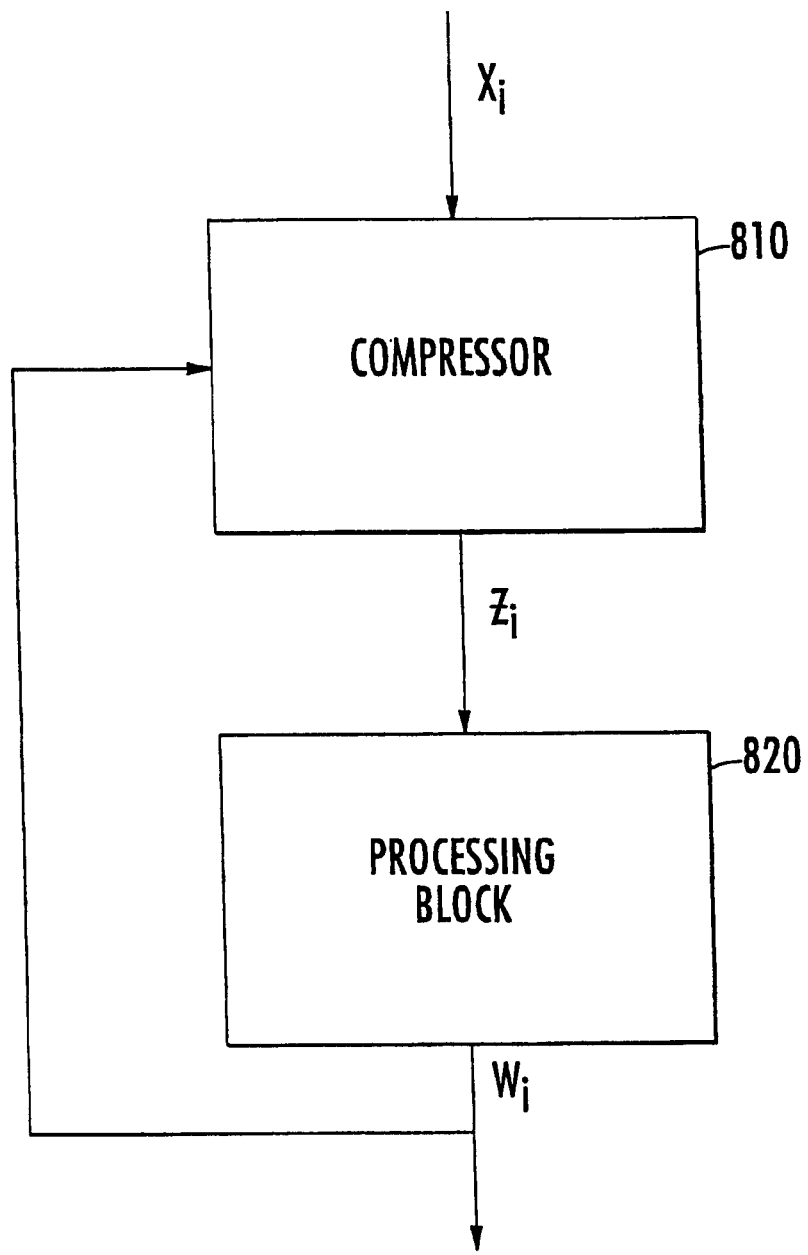
FIG. 8 is a block diagram illustrating compression according to additional embodiments of the present invention.

FIG. 8 is a block diagram illustrating additional compressors according to the present invention. As shown in FIG. 8, an input $x_i$ is fed into a compressor 810, and once compressed, the compressed input signal is fed to a processing block 820. The output $w_i$ of the processing block 820 is then fed back into the compressor 810, where further compression may be performed. The compressor 810 can then use the output of processing block 820 to determine whether or not further compression should be performed. If so, the compressor 810 further compresses the output of processing block 810, and outputs the compressed output to processing block 820, where further processing can be performed to provide a second pass output signal $w_i$. On the other hand, if a second iteration of compression is not performed at compressor 810, the initial output from processing block 820 can be provided as the compressed output. A plurality of iterations of compression and processing can thus be performed according to embodiments of the present invention. Alternately, the compressor can initially pass the input samples to the processing block without compression, so that an iteration of processing is performed before an initial iteration of compression.

Various aspects of the present invention have been illustrated in detail in the figures. It will be understood that individual blocks of the figures, and combinations of blocks in the figures, can be implemented by computer program instructions. These computer program instructions may be provided to a processor or other programmable data processing apparatus to produce a machine, such that the instructions which execute on the processor or other programmable data processing apparatus create means for implementing the functions specified in the block or blocks. These computer program instructions may also be stored in a computer-readable memory that can direct a processor or other programmable data processing apparatus to function in a particular manner, such that the instructions stored in the computer-readable memory produce an article of manufacture including instruction means which implement the functions specified in the block or blocks.

Accordingly, blocks of the figures support combinations of means for performing the specified functions, combinations of steps for performing the specified functions and program instruction means for performing the specified functions. It will also be understood that individual blocks of the figures, and combinations of blocks in the flowchart illustrations, can be implemented by special purpose hardware-based computer systems which perform the specified functions or steps, or by combinations of special purpose hardware and computer instructions.

In the drawings and specification, there have been disclosed typical preferred embodiments of the invention and, although specific terms are employed, they are used in a generic and descriptive sense only and not for purposes of limitation. The broad principles of the invention have been described above, and numerous ways in which the invention can be adapted have been pointed out. All such variations are considered to fall within the scope and spirit of the invention as described by the following claims.

What is claimed is:

1. A method of compressing an audio signal, the method comprising:

accepting input samples of the audio signal wherein the input samples include non-zero input samples and wherein the input samples including the non-zero input samples are included in one radiotelephone communications frame of a plurality of radiotelephone communications frames;

calculating a logarithm of each of the non-zero input samples of the radiotelephone communications frame of the audio signal; and determining a compressed output sample for each non-zero input sample of the radiotelephone communications frame based on the logarithm of each respective non-zero input sample of the radiotelephone communications frame.

2. A method according to claim 1 wherein determining a compressed output sample for each non-zero input sample comprises applying compression on a frame by frame basis.

3. A method according to claim 1, wherein a linear relationship exists between logarithms of the non-zero input samples and logarithms of the corresponding compressed output samples.

4. A method according to claim 3, wherein the logarithm of each compressed output sample corresponding to a non-zero input sample is further based on the product of the logarithm of each corresponding non-zero input sample and the compression factor plus a logarithm of a system gain.

5. A method according to claim 1, wherein a logarithm of each compressed output sample, corresponding to a non-zero input sample, is based on a product of a logarithm of each corresponding non-zero input sample and a compression factor.

6. A method according to claim 5, wherein the compression factor is based on at least one of the logarithm of a clipping level, a logarithm of a system gain, and a logarithm of an absolute value of a peak input sample.

7. A method according to claim 6, wherein the compression factor is based on a difference between the logarithm of the clipping level and the logarithm of the system gain.

8. A method according to claim 7, wherein the compression factor is based on a difference between the logarithm of a clipping level and the logarithm of the system gain, wherein the difference is divided by the logarithm of the absolute value of the peak input sample.

9. A method according to claim 6, wherein the peak input sample is one of the plurality of input samples for which a compressed output sample is calculated.

10. A method according to claim 6, wherein the peak input sample is a peak input sample prior to the input samples for which compressed output samples are determined.

11. A method according to claim 3, wherein the system gain is variable for each of the non-zero input samples.

12. A method according to claim 1, further comprising:
providing a measurement for each of the non-zero samples, wherein determining the compression for each of the non-zero input samples is further based on the measurement for one of the samples.

13. A method according to claim 12, wherein providing a measurement for each of the non-zero input samples further comprises determining one of the non-zero input samples having a peak absolute value, wherein determining the compression for each of the non-zero samples is further based on the peak absolute value.

14. A method of compressing an audio signal, the method comprising:
accepting a radiotelephone communications frame including input samples of the audio signal wherein the radiotelephone communications frame of input samples includes non-zero input samples and wherein the frame is one of a plurality of radiotelephone communications frames of the audio signal;
providing a measurement of one of the non-zero input samples of the radiotelephone communications frame; and
determining compressed output samples for each non-zero input sample of the radiotelephone communications frame based on the measurement of one of the non-zero input samples of the radiotelephone communications frame.

15. A method according to claim 14, wherein the step of providing a measurement of one of the non-zero input samples of the frame, further comprises determining an absolute value of a peak non-zero input sample of the frame, wherein determining compressed output samples for each non-zero input sample of the frame is based on the absolute value of the peak non-zero input sample of the frame.

16. A method according to claim 15, further comprising:
calculating a logarithm of the absolute value of the peak non-zero input sample of the frame.

17. A method according to claim 16, wherein the step of determining compressed output samples for each non-zero input sample of the frame comprises determining compressed output samples for each non-zero input sample of the frame based on the logarithm of the absolute value of the peak non-zero input sample of the frame.

18. A method according to claim 14, wherein a linear relationship exists between logarithms of the non-zero input samples and logarithms of the corresponding compressed output samples.

19. A method according to claim 14, wherein a logarithm of each compressed output sample corresponding to a non-zero input sample is based on a product of a logarithm of each corresponding non-zero input sample and a compression factor plus a logarithm of a system gain.

20. A method according to claim 19, wherein the compression factor is equal to the logarithm of the peak absolute value of the non-zero input sample of the frame.

21. A method according to claim 19, wherein the system gain is variable for each non-zero input sample.

22. A method according to claim 21, wherein providing a measurement of one of the non-zero input samples of the frame comprises determining an absolute value of a peak product of each non-zero input sample of the frame and a corresponding variable system gain.

23. A method according to claim 14 wherein determining compressed output samples for each non-zero input sample comprises applying compression on a frame by frame basis.

24. A method of compressing an audio signal, the method comprising:
accepting input samples of the audio signal wherein the input samples include non-zero input samples and wherein the input samples are included in one radiotelephone communications frame of a plurality of radiotelephone communications frames;
providing an absolute value of a peak non-zero input sample of the radiotelephone communications frame; and
determining compressed output samples for at least a plurality of the non-zero input samples of the radiotelephone communications frame based on the absolute value of the peak non-zero input sample of the radiotelephone communications frame.

25. A method according to claim 24, further comprising:
calculating a logarithm of the absolute value of the peak non-zero input sample.

26. A method according to claim 24, wherein a common linear relationship exists between logarithms of the non-zero input samples and logarithms of the corresponding compressed output samples.

27. A method according to claim 26, wherein a logarithm of each compressed output sample is based on a product of a logarithm of a corresponding non-zero input sample and a compression factor.

28. A method according to claim 26, wherein a logarithm of each compressed output sample is based on a product of a logarithm of a corresponding non-zero input sample and a compression factor plus a logarithm of a system gain.

29. A method according to claim 28, wherein the system gain is variable for each non-zero input sample.

30. A method according to claim 24, wherein the input samples comprise at least two frames of input samples and wherein the peak non-zero input sample is from a first frame and wherein the compressed output samples correspond to non-zero input samples of a second frame.

31. A method according to claim 24 wherein determining compressed output samples comprises applying compression on a frame by frame basis.

32. A computer program product for compressing an audio signal, the computer program product comprising a computer-readable storage medium having computer-readable program code embodied therein, the computer-readable program code comprising:
computer-readable program code that accepts input samples of the audio signal wherein the input samples include non-zero input samples and wherein the input samples including the non-zero input samples are included in one radiotelephone communications frame of a plurality of radiotelephone communications frames;
computer-readable program code that calculates a logarithm of each of the non-zero input samples of the radiotelephone communications frame of the audio signal; and
computer-readable program code that determines a compressed output sample for each non-zero input sample of the radiotelephone communications frame based on the logarithm of each respective non-zero input sample of the radiotelephone communications frame.

33. A computer program product according to claim 32, wherein a linear relationship exists between logarithms of the non-zero input samples and logarithms of the corresponding compressed output samples.

34. A computer program product according to claim 33, wherein the system gain is variable for each of the non-zero input samples.

35. A computer program product according to claim 32, wherein a logarithm of each compressed output sample, corresponding to a non-zero input sample is based on a product of a logarithm of each corresponding non-zero input sample and a compression factor.

36. A computer program product according to claim 33, wherein the logarithm of each compressed output sample corresponding to a non-zero input sample is further based on the product of the logarithm of each corresponding non-zero input sample and the compression factor plus a logarithm of a system gain.

37. A computer program product according to claim 35, wherein the compression factor is based on at least one of the logarithm of a clipping level, a logarithm of a system gain, and a logarithm of an absolute value of a peak input sample.

38. A computer program product according to claim 37, wherein the compression factor is based on a difference between the logarithm of the clipping level and the logarithm of the system gain.

39. A computer program product according to claim 38, wherein the compression factor is based on a difference between the logarithm of a clipping level and the logarithm of the system gain, wherein the difference is divided by the logarithm of the absolute value of the peak input sample.

40. A computer program product according to claim 37, wherein the peak input sample is one of the plurality of input samples for which a compressed output sample is calculated.

41. A computer program product according to claim 37, wherein the peak input sample is a peak input sample prior to the input samples for which compressed output samples are determined.

42. A computer program product according to claim 32, further comprising:
computer-readable program code that provides a measurement for each of the non-zero samples, wherein the determining the compression for each of the non-zero input samples is further based on the measurement for one of the samples.

43. A computer program product according to claim 42, wherein providing a measurement for each of the non-zero input samples further comprises determining one of the non-zero input samples having a peak absolute value, wherein determining the compression for each of the non-zero samples is further based on the peak absolute value.

44. A computer program product according to claim 32 wherein the computer-readable program code that determined a compressed output sample for each non-zero input sample applies compression on a frame by frame basis.

45. A computer program product for compressing an audio signal, the computer program product comprising a computer-readable storage medium having computer-readable program code embodied in the medium, the computer-readable program code comprising:
computer-readable program code that accepts a radiotelephone communications frame of input samples of the audio signal wherein the radiotelephone communications frame of input samples includes non-zero input samples and wherein the frame is one of a plurality of radiotelephone communications frames of the audio signal;
computer-readable program code that provides a measurement of one of the non-zero input samples of the radiotelephone communications frame; and
computer-readable program code that determines compressed output samples for each non-zero input sample of the radiotelephone communications frame based on the measurement of one of the non-zero input samples of the radiotelephone communications frame.

46. A computer program product according to claim 45, wherein providing a measurement of one of the non-zero input samples of the frame further comprises determining an absolute value of a peak non-zero input sample of the frame, wherein determining compressed output samples for each non-zero input sample of the frame is based on the absolute value of the peak non-zero input sample of the frame.

47. A computer program product according to claim 46, further comprising:
computer-readable program code that calculates a logarithm of the absolute value of the peak non-zero input sample of the frame.

48. A computer program product according to claim 47, wherein determining compressed output samples for each non-zero input sample of the frame comprises determining compressed output samples for each non-zero input sample of the frame based on the logarithm of the absolute value of the peak non-zero input sample of the frame.

49. A computer program product according to claim 45, wherein a linear relationship exists between logarithms of the non-zero input samples and logarithms of the corresponding compressed output samples.

50. A computer program product according to claim 45, wherein a logarithm of each compressed output sample corresponding to a non-zero input sample is based on a product of a logarithm of each corresponding non-zero input sample and a compression factor plus a logarithm of a system gain.

51. A computer program product according to claim 50, wherein the compression factor is equal to the logarithm of the peak absolute value of the non-zero input sample of the frame.

52. A computer program product according to claim 50, wherein the system gain is variable for each non-zero input sample.

53. A computer program product according to claim 52, wherein providing a measurement of one of the non-zero input samples of the frame comprises determining an absolute value of a peak product of each non-zero input sample of the frame and a corresponding variable system gain.

54. A computer program product according to claim 45 wherein the computer-readable program code that determines compressed output samples for each non-zero input sample applies compression on a frame by frame basis.

55. A computer program product for compressing an audio signal, the computer program product comprising a computer-readable storage medium having computer-readable program code embodied in the medium, the computer-readable program code comprising:
computer-readable program code that accepts input samples of the audio signal wherein the input samples include non-zero input samples and wherein the input samples are included in one radiotelephone communications frame of a plurality of radiotelephone communications frames;
computer-readable program code that provides an absolute value of a peak non-zero input sample of the radiotelephone communications frame; and
computer-readable program code that determines compressed output samples for at least a plurality of the non-zero input samples of the radiotelephone communications frame based on the absolute value of the peak non-zero input sample of the radiotelephone communications frame.

56. A computer program product according to claim 55, wherein a common linear relationship exists between logarithms of the non-zero input samples and logarithms of the corresponding compressed output samples.

57. A computer program product according to claim 56, wherein a logarithm of each compressed output sample is based on a product of a logarithm of a corresponding non-zero input sample and a compression factor.

58. A computer program product according to claim 56, wherein a logarithm of each compressed output sample is based on a product of a logarithm of a corresponding non-zero input sample and a compression factor plus a logarithm of a system gain.

59. A computer program product according to claim 58, wherein the system gain is variable for each non-zero input sample.

60. A computer program product according to claim 55, wherein the input samples comprise at least two frames of input samples and wherein the peak non-zero input sample is from a first frame and wherein the compressed output samples correspond to non-zero input samples of a second frame.

61. A computer program product according to claim 55, further comprising:
 computer-readable program code that calculates a logarithm of the absolute value of the peak non-zero input sample.

62. A computer program product according to claim 55 wherein the computer-readable program code that determines compressed output samples applies compression on a frame by frame basis.

63. A communications device comprising:
 an audio processing unit that provides input samples of the audio signal wherein the input samples include non-zero input samples and wherein the input samples including the non-zero input samples are included in one radiotelephone communications frame of a plurality of radiotelephone communications frames; and
 a compressor that calculates a logarithm of each of the non-zero input samples of the radiotelephone communications frame of the audio signal, and that determines a compressed output sample for each non-zero input sample of the radiotelephone communications frame based on the logarithm of each respective non-zero input sample of the radiotelephone communications frame.

64. A communications device according to claim 63, wherein a linear relationship exists between logarithms of the non-zero input samples and logarithms of the corresponding compressed output samples.

65. A communications device according to claim 64, wherein the logarithm of each compressed output sample corresponding to a non-zero input sample is further based on the product of the logarithm of each corresponding non-zero input sample and the compression factor plus a logarithm of a system gain.

66. A communications device according to claim 64, wherein the system gain is variable for each of the non-zero input samples.

67. A communications device according to claim 63, wherein a logarithm of each compressed output sample, corresponding to a non-zero input sample, is based on a product of a logarithm of each corresponding non-zero input sample and a compression factor.

68. A communications device according to claim 67, wherein the compression factor is based on at least one of the logarithm of a clipping level, a logarithm of a system gain, and a logarithm of an absolute value of a peak input sample.

69. A communications device according to claim 68, wherein the peak input sample is one of the plurality of input samples for which a compressed output sample is calculated.

70. A communications device according to claim 68, wherein the peak input sample is a peak input sample prior to the input samples for which compressed output samples are determined.

71. A communications device according to claim 68, wherein the compression factor is based on a difference between the logarithm of the clipping level and the logarithm of the system gain.

72. A communications device according to claim 71, wherein the compression factor is based on a difference between the logarithm of a clipping level and the logarithm of the system gain, wherein the difference is divided by the logarithm of the absolute value of the peak input sample.

73. A communications device according to claim 63, wherein the compressor provides a measurement for each of the non-zero samples, and wherein determining the compression for each of the non-zero input samples is further based on the measurement for one of the samples.

74. A communications device according to claim 73, wherein providing a measurement for each of the non-zero input samples further comprises determining one of the non-zero input samples having a peak absolute value, wherein determining the compression for each of the non-zero samples is further based on the peak absolute value.

75. A communications device according to claim 63, wherein the compressor applies compression on a frame by frame basis.

76. A communications device comprising:
 an audio processing unit that provides a radiotelephone communications frame of input samples of the audio signal wherein the radiotelephone communications frame of input samples includes non-zero input samples and wherein the frame is one of a plurality of radiotelephone communications frames of the audio signal;
 a compressor that provides a measurement of one of the non-zero input samples of the radiotelephone communications frame, and that determines compressed output samples for each non-zero input sample of the radiotelephone communications frame based on the measurement of one of the non-zero input samples of the radiotelephone communications frame.

77. A communications device according to claim 76, wherein providing a measurement of one of the non-zero input samples of the frame further comprises determining an absolute value of a peak non-zero input sample of the frame, wherein determining compressed output samples for each non-zero input sample of the frame is based on the absolute value of the peak non-zero input sample of the frame.

78. A communications device according to claim 77, wherein the compressor calculates a logarithm of the absolute value of the peak non-zero input sample of the frame.

79. A communications device according to claim 78, wherein determining compressed output samples for each non-zero input sample of the frame comprises determining compressed output samples for each non-zero input sample of the frame based on the logarithm of the absolute value of the peak non-zero input sample of the frame.

80. A communications device according to claim 76, wherein a linear relationship exists between logarithms of the non-zero input samples and logarithms of the corresponding compressed output samples.

81. A communications device according to claim 76, wherein a logarithm of each compressed output sample corresponding to a non-zero input sample is based on a product of a logarithm of each corresponding non-zero input sample and a compression factor plus a logarithm of a system gain.

82. A communications device according to claim 81, wherein the compression factor is equal to the logarithm of the peak absolute value of the non-zero input sample of the frame.

83. A communications device according to claim 81, wherein the system gain is variable for each non-zero input sample.

84. A communications device according to claim 83, wherein providing a measurement of one of the non-zero input samples of the frame comprises determining an absolute value of a peak product of each non-zero input sample of the frame and a corresponding variable system gain.

85. A communications device according to claim 76 wherein the compressor applies compression on a frame by frame basis.

86. A communications device comprising:
   an audio processing unit that provides input samples of the audio signal wherein the input samples include non-zero input samples and wherein the input samples are included in one radiotelephone communications frame of a plurality of radiotelephone communications frames; and
   a compressor that provides an absolute value of a peak non-zero input sample of the radiotelephone communications frame, and that determines compressed output samples for at least a plurality of the non-zero input samples of the radiotelephone communications frame based on the absolute value of the peak non-zero input sample of the radiotelephone communications frame.

87. A communications device according to claim 86, wherein the compressor calculates a logarithm of the absolute value of the peak non-zero input sample.

88. A communications device according to claim 86, wherein a common linear relationship exists between logarithms of the non-zero input samples and logarithms of the corresponding compressed output samples.

89. A communications device according to claim 88, wherein a logarithm of each compressed output sample is based on a product of a logarithm of a corresponding non-zero input sample and a compression factor.

90. A communications device according to claim 88, wherein a logarithm of each compressed output sample is based on a product of a logarithm of a corresponding non-zero input sample and a compression factor plus a logarithm of a system gain.

91. A communications device according to claim 90, wherein the system gain is variable for each non-zero input sample.

92. A communications device according to claim 86, wherein the input samples comprise at least two frames of input samples and wherein the peak non-zero input sample is from a first frame and wherein the compresses output samples correspond to non-zero input samples of a second frame.

93. A communications device according to claim 86 wherein the compressor applies compression on a frame by frame basis.

* * * * *